(12) United States Patent
Kuwabara et al.

(10) Patent No.: US 9,653,834 B2
(45) Date of Patent: May 16, 2017

(54) PRINTED CIRCUIT BOARD INSULATION STRUCTURE FOR ELECTRONIC DEVICE

(71) Applicant: FUJI ELECTRIC CO., LTD., Kawasaki-shi, Kanagawa (JP)

(72) Inventors: Takashi Kuwabara, Hino (JP); Ryuji Yamada, Hachioji (JP)

(73) Assignee: FUJI ELECTRIC CO., LTD., Kawasaki-Shi, Kanagawa ( * ) Notice: Subject to any disclaimer, the term of this patent is extended or adjusted under 35 U.S.C. 154(b) by 0 days.

(21) Appl. No.: 15/253,106

(22) Filed: Aug. 31, 2016

(65) Prior Publication Data

US 2017/0110822 A1    Apr. 20, 2017

(30) Foreign Application Priority Data

Oct. 20, 2015   (JP) .................... 2015-206290

(51) Int. Cl.
  *H05K 7/14*       (2006.01)
  *H01R 13/424*   (2006.01)
  (Continued)

(52) U.S. Cl.
  CPC .......... *H01R 13/424* (2013.01); *H01B 17/14* (2013.01); *H05K 5/04* (2013.01); *H05K 7/1407* (2013.01); *H05K 7/1427* (2013.01)

(58) Field of Classification Search
  CPC . F16M 13/02; F21S 2/00; F21V 21/00; F21V 29/00; G02B 6/0073; G02B 6/0083; G02B 6/0068; G02F 1/13; G02F 1/1333; G02F 1/133603; G01R 1/07342; G01R 3/00; G01R 31/2889; H01B 17/14; H01F 21/06; H01R 13/424; H01R 12/57; H01R 12/718; H05K 1/115; H05K 1/141; H05K 1/0284; H05K 3/36; H05K 5/02; H05K 5/04; H05K 7/1061; H05K 7/1407; H05K 7/1427; H05K 2201/10598; H05K 2201/09145; H05K 2203/061; H01J 11/00;
  (Continued)

(56) References Cited

U.S. PATENT DOCUMENTS 3,267,401 A * 8/1966 Hotine .................... H01F 21/06
                                                                336/136
3,631,297 A * 12/1971 Conner ................ H05K 1/0271
                                                                174/255
(Continued)

FOREIGN PATENT DOCUMENTS

JP      2012-200071 A     10/2012
KR     20100100481 A  *  9/2010

*Primary Examiner* — Timothy Thompson
*Assistant Examiner* — Guillermo Egoavil
(74) *Attorney, Agent, or Firm* — Rabin & Berdo, P.C.

(57) ABSTRACT

A printed circuit board is fixed to a resin insulation plate by using a first metal screw, and a metal casing is fixed to the resin insulation plate by using a second metal screw. The cuboid insulation plate is arranged to match the shapes of the long sides of the printed circuit board and the metal casing necessary for screw fixation. The first and second metal screws are attached to the resin insulation plate with a lateral shift. This makes it possible to reduce the insulation distance around the first metal screw on the printed circuit board and to increase the wiring pattern area and the component mounting space, realizing a reduction in the size of an electronic device.

5 Claims, 5 Drawing Sheets

(51) Int. Cl.
*H05K 5/04* (2006.01)
*H01B 17/14* (2006.01)

(58) Field of Classification Search
CPC ............ H01J 37/3244; H01J 37/32192; H01L 21/67069; H01L 33/64; Y10T 29/49826
USPC .................... 174/262, 250, 535; 313/231.31; 324/754.07, 756.03; 336/136, 87; 349/65; 361/679.01; 362/249.06, 612
See application file for complete search history.

(56) References Cited

U.S. PATENT DOCUMENTS

| | | | | |
|---|---|---|---|---|
| 3,931,456 | A * | 1/1976 | McChesney, Jr. | ..... H01B 17/14 174/145 |
| 2009/0268406 | A1* | 10/2009 | Isomoto | ............. H05K 7/20918 361/697 |
| 2011/0128685 | A1* | 6/2011 | Tokikawa | ............... F16M 13/02 361/679.01 |
| 2012/0098405 | A1* | 4/2012 | Chen | ................. H01J 37/32192 313/231.31 |
| 2012/0212248 | A9* | 8/2012 | Chong | ............... G01R 1/07342 324/754.07 |
| 2013/0229596 | A1* | 9/2013 | Hosoki | ................... F21V 21/00 349/65 |
| 2015/0060126 | A1* | 3/2015 | Malek | ................. H05K 1/0284 174/262 |

* cited by examiner

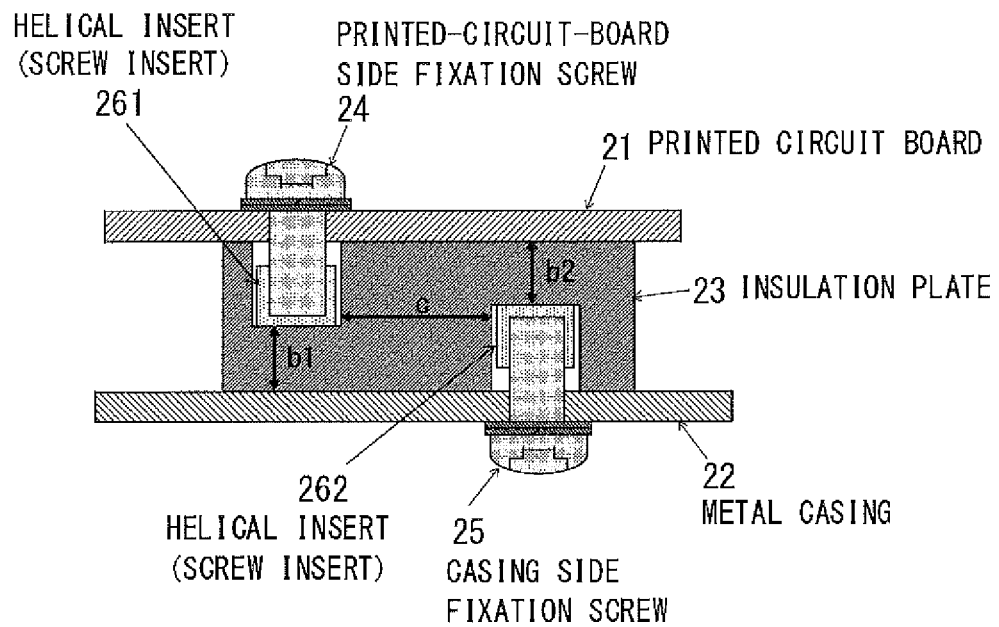
F I G. 4 A

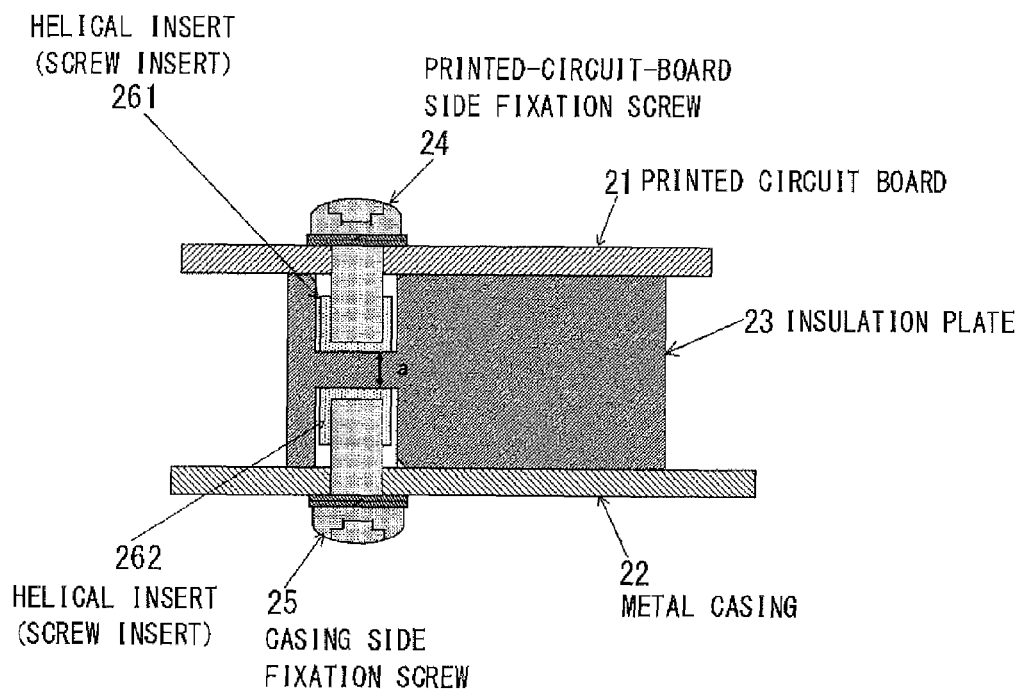
F I G. 4 B

PRINTED CIRCUIT BOARD INSULATION STRUCTURE FOR ELECTRONIC DEVICE

CROSS REFERENCE TO RELATED APPLICATION

This application is based upon and claims the benefit of priority of the prior Japanese patent Application No. 2015-206290, filed on Oct. 20, 2015, the entire contents of which are incorporated herein by reference.

FIELD

The present invention is related to a printed circuit board insulation structure that fixes a printed circuit board in an electronic device to a metal casing via a resin insulation plate and by using a metal screw.

BACKGROUND

When engineers fix a printed circuit board in an electronic device to a metal casing by using a metal screw, a metal spacer having screw threads inside is pressed into (or welded to) a metal casing and the printed circuit board is fixed via that spacer to the metal casing by using a metal screw, as in a widely accepted method, which is shown in FIG. 1.

For example, FIG. 1 discloses a printed circuit board insulation structure for an electronic device that fixes a printed circuit board 31 to a metal casing 32 by using a printed circuit board fixation screw 34 after the engineer in advance pressed a metal spacer 33 into the metal casing 32 (or after welding the metal spacer 33 to the metal casing 32) as disclosed also in Patent Document 1 below.

Note that a sectoral wiring pattern prohibition area 36 is set in a prescribed range from the printed circuit board fixation screw 34 in the printed circuit board 31 in consideration of an insulation distance and a design margin defined by a standard.

Also, a technique of fixing a printed circuit board 41 to a metal casing 42 by using a metal screw via a commercially available insulation support 43 similarly to the technique in FIG. 1 is conventionally known for a case when an engineer desires to fix the printed circuit board 41 to the metal casing 42 while insulating them from each other, as shown in FIG. 2.

In the printed circuit board insulation structure shown in FIG. 1 above, the printed circuit board fixation screw 34 and the metal casing 32 have the same electric potential. The metal casing 32 is connected to for example the frame ground (FG) in order to fix the electric potential.

In this situation, an insulation distance and the wiring pattern prohibition area 36 for a design margin need to be set for the outer periphery of the washer of the screw 34 around the printed circuit board fixation screw 34, the insulation distance being based on a standard defined by a safety standard mainly for electric appliances in the US, authorized by IEC (International Electro-technical Commission) and UL (Underwriters Laboratories Inc.).

In particular, when the operation voltage for a printed circuit board is high, the wiring pattern prohibition area 36 becomes very large, reducing the wiring pattern area and the component mounting area and also making the electronic device larger, which is problematic.

Also, in the method of fixing the printed circuit board 41 to the metal casing 42 in the conventional printed circuit board insulation structure shown in FIG. 2, the commer-cially available support 43 itself is relatively large, leading to a larger electronic device large, which is problematic.

[Patent Document 1] Japanese Laid-open Patent Publication No. 2012-200071

SUMMARY

It is an object of the present invention to provide a printed circuit board insulation structure for an electronic device that can realize a reduction in the size of an electronic device by fixing a printed circuit board and a metal casing via an insulation plate by using first and second screws that are arranged with a lateral shift. In order to solve the above problem, the invention of claim 1 is a printed circuit board insulation structure for fixing a printed circuit board in an electronic device to a metal casing by using a metal screw via a resin insulation plate, wherein the metal screw includes a first screw and a second screw and the first and second screws are fastened to first and second helical inserts embedded in the insulation plate, and fastening positions of the first and second screws are arranged with a lateral shift on the insulation plate, and a lateral distance between the first and second helical inserts is equal to or greater than at least a distance between a bottom surface of the first helical insert and the metal casing and a distance between a bottom surface of the second helical insert and the printed circuit board.

The invention of claim 2 is the printed circuit board insulation structure according to claim 1, wherein the first screw is a fixation screw provided on a printed circuit board side and the second screw is a fixation screw provided on a metal casing side.

The invention of claim 3 is the above printed circuit board insulation structure, wherein the first helical insert is a helical insert provided on the printed circuit board side and the second helical insert is a helical insert provided on the metal casing side.

The invention of claim 4 is the above printed circuit board insulation structure, wherein the first screw is insulated from the metal casing by the insulation plate, an electric potential of the first screw is connected and fixed to an electric potential in a circuit on the printed circuit board in order to make the electric potential of the first screw different from an electric potential of the metal casing, and the electric potential of the first screw is made to match an electric potential of a wiring pattern of a printed circuit board around the screw and is fixed to an electric potential that minimizes the insulation distance between the first screw and the metal casing.

The invention of claim 5 is the above printed circuit board insulation structure, wherein the insulation plate is configured to be a cuboid, and the insulation plate is arranged so as to match shapes of long sides of the printed circuit board and the metal casing.

The present invention can reduce the insulation distance around a first screw (printed-circuit-board side fixation screw) on a printed circuit board, increasing the wiring pattern area and the component mounting space and realizing a reduction in the size of an electronic device.

Also, the resin insulation plate of the present invention is configured to be a cuboid, and the insulation plate is arranged so as to match the shapes of the long sides of the printed circuit board and the metal casing, resulting in a structure that allows the outer air to flow to the wiring pattern and the component area provided on the center side of the printed circuit board, and thereby can also realize heat dissipation from mounted components.

BRIEF DESCRIPTION OF DRAWINGS

FIG. 4A is a partial sectional view showing an arrangement example of fixation screws according to an embodiment of the present invention; and FIG. 4B is a partial sectional view showing an example for comparison with the arrangement example of fixation screws shown in FIG. 4A.

DESCRIPTION OF EMBODIMENTS

Figure 1:
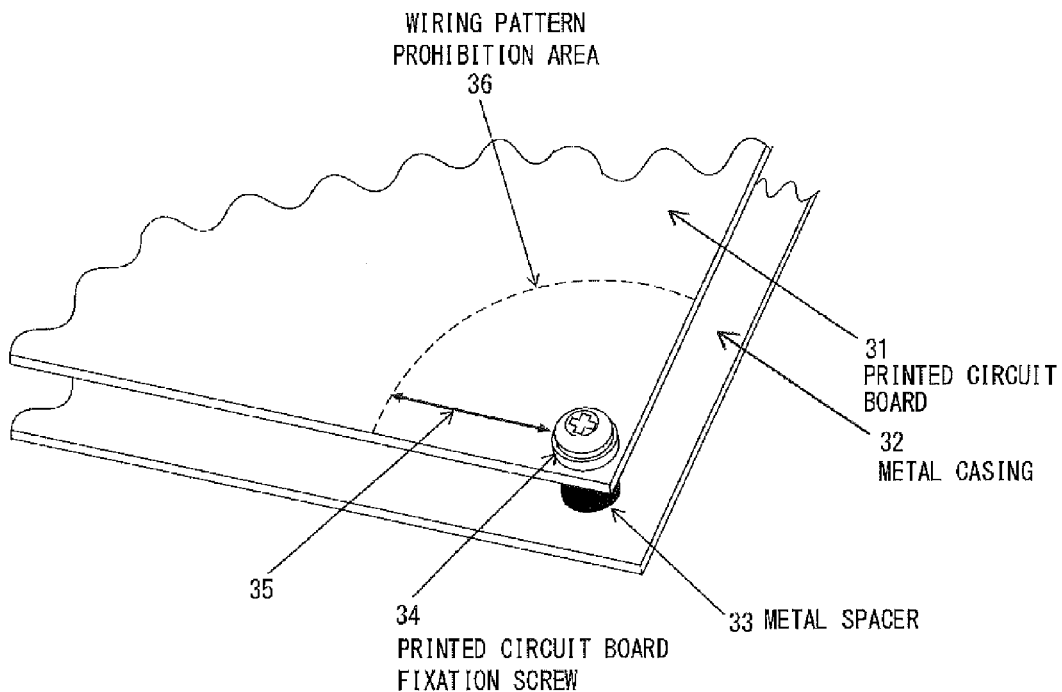
FIG. 1 is a partial perspective view of a conventional printed circuit board insulation structure for an electronic device viewed from above.
Figure 2:
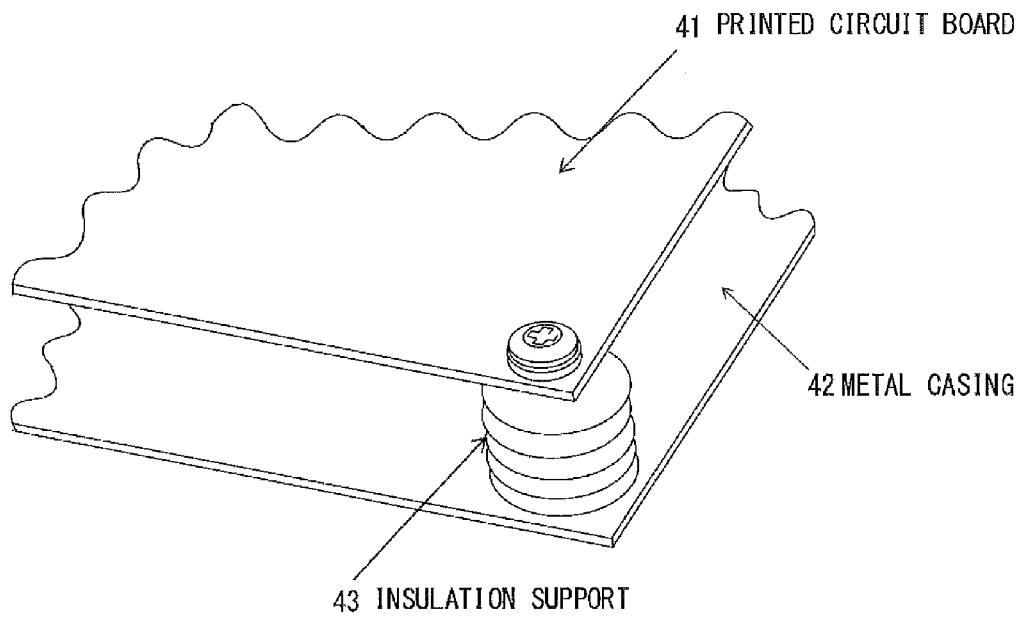
FIG. 2 is a partial perspective view of a different example of a conventional printed circuit board insulation structure for an electronic device viewed from above.

Hereinafter, the embodiments of the present invention will be explained in detail by referring to the drawings.

Figure 3A:
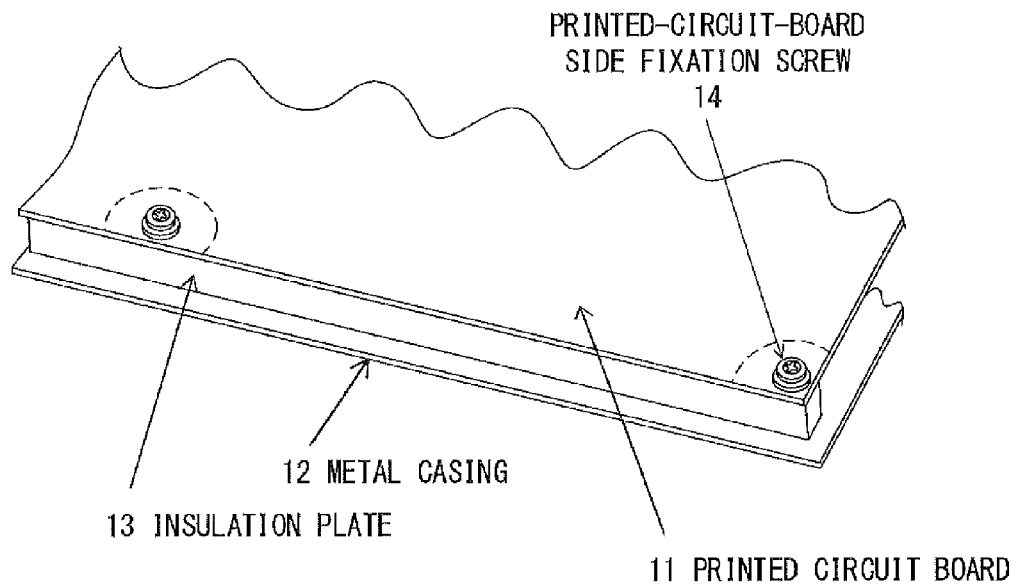
FIG. 3A is a partial perspective view showing a printed circuit board insulation structure for an electronic device, viewed from above, according to an embodiment of the present invention.
Figure 3B:
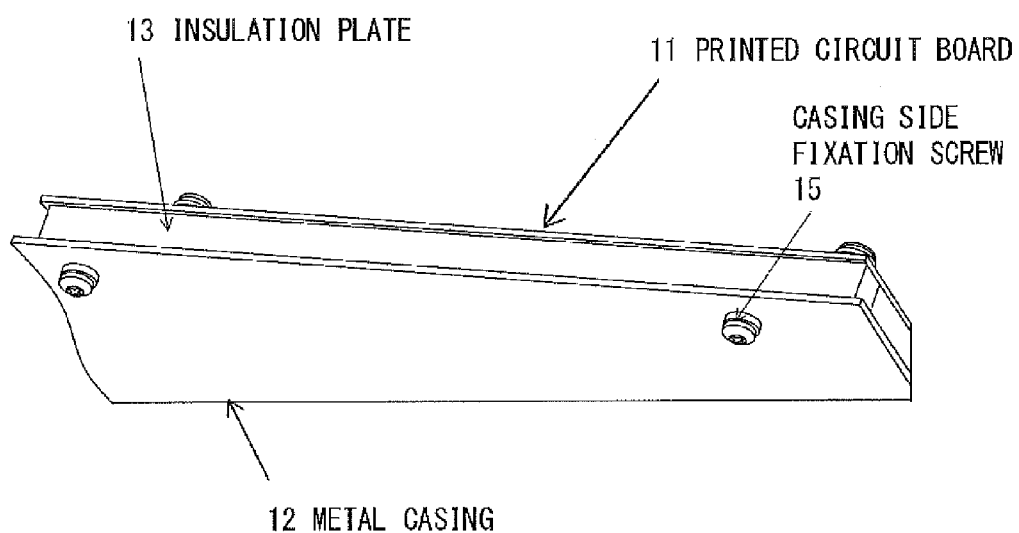
FIG. 3B is a partial perspective view of the printed circuit board insulation structure for an electronic device, viewed from the back surface, shown in FIG. 3A.

FIG. 3A and FIG. 3B are perspective views showing a printed circuit board insulation structure for an electronic device according to an embodiment of the present invention.

FIG. 3A is a partial perspective view of the printed circuit board insulation structure in an electronic device, viewed from above, according to an embodiment of the present invention, in which a printed circuit board 11 is fixed to a resin insulation plate 13 by using a metal screw (first screw) 14.

FIG. 3B is a partial perspective view, corresponding to FIG. 3A above, of the printed circuit board insulation structure in an electronic device, viewed from below, according to an embodiment of the present invention.

In FIG. 3B, similarly to FIG. 3A, the printed circuit board 11 is fixed to the resin insulation plate 13 by using the metal screw (first screw) 14, and a metal casing 12 is fixed to the resin insulation plate 13 by using a metal screw (second screw) 15.

As seen in FIG. 3B, in the printed circuit board insulation structure for an electronic device of the present invention, the fixation positions for the metal screws 14 and 15 to the resin insulation plate 13 are shifted.

This will be described later.

As described above, the printed circuit board insulation structure for an electronic device according to the present invention fixes the printed circuit board 11 and the metal casing 12 to each other via the resin insulation plate 13 and by using the metal screws 14 and 15.

As shown in FIG. 3A and FIG. 3B, the resin insulation plate 13 is arranged so as to match the shapes of the long sides of the printed circuit board 11 and the metal casing 12 necessary for the screw fixation.

In FIG. 3A and FIG. 3B, part of the shape of one of the long sides is shown, and the shape of the other one of the long sides is omitted.

In other words, the resin insulation plate 13 is arranged so as to match the shapes of the long sides of the printed circuit board 11 and the metal casing 12, resulting in a structure that allows the outer air to flow to the wiring pattern area and the component area provided at around the center of the printed circuit board, and thereby heat dissipation from mounted components is realized.

FIG. 4A is a partial sectional view showing an arrangement example of fixation screws according to an embodiment of the present invention, and is a sectional view of the printed circuit board, the insulation plate and the portions around the fixing screws including the metal casing.

In the arrangement example shown in FIG. 4A, a metal screw 24 for fixing a printed circuit board 21 is fastened/fixed to a helical insert (screw insert) 261 embedded in an insulation plate 23.

Also, a metal screw 25 for fixing a metal casing 22 is fastened/fixed to a helical insert (screw insert) 262 embedded in the insulation plate 23.

In the above situation, the printed-circuit-board side fixation screw 24 and the metal-casing side fixation screw 25 are not arranged on the same line and are arranged at different positions at a certain interval, which will be described later.

The insulation performance (dielectric withstanding voltage value) of the arrangement example shown in FIG. 4A is proportional to the distance between the bottom surface of the printed-circuit-board side helical insert 261 and the metal casing 22 (=dimension b1) or the distance between the bottom surface of the metal-casing side helical insert 262 and the printed circuit board 21 (=dimension b2), and the greater this distance is (the larger this dimension is), the higher the dielectric withstanding voltage value is.

In the arrangement example shown in FIG. 4A, differently from the comparison example shown in FIG. 4B, which will be described later, the printed-circuit-board side fixation screw 24 and the metal-casing side fixation screw 25 are arranged with a lateral shift so as to make the lateral distance (=dimension c) between the printed-circuit-board side helical insert 261 and the metal-casing side helical insert 262 equal to or greater than at least the above dimension b1 or b2 (c≥b1, b2), and thereby it is possible to prevent the size of the electronic device from increasing.

FIG. 4B is a partial sectional view showing an example for comparison with the arrangement example of fixation screws shown in FIG. 4A, and is a sectional view of the printed circuit board, the insulation plate and the portions around the fixing screws including the metal casing.

In the comparison example shown in FIG. 4B, the metal screw 24 for fixing the printed circuit board 21 is fastened/fixed to the helical insert (screw insert) 261 embedded in the insulation plate 23 and the metal-casing side fixation screw 25 for fixing the metal casing 22 is fastened/fixed to the helical insert (screw insert) 262 embedded in the insulation plate 23.

The insulation performance (dielectric withstanding voltage value) in FIG. 4B is proportional to the distance between the bottom surface of the printed-circuit-board side helical insert 261 and the bottom surface of the metal-casing side helical insert 262 (=dimension a), and the greater this distance is (the larger this dimension is), the higher the dielectric withstanding voltage value is.

However, when the printed-circuit-board side fixation screw 24 and the metal-casing side fixation screw 25 are arranged on the same line as shown in FIG. 4B, dimension a has to be large in order to achieve a high dielectric withstanding voltage value, and this leads to a larger height dimension of the insulation plate 23 and a larger size of the electronic device.

As described above, according to the arrangement example of the fixation screws according to the embodiment of the present invention, the printed-circuit-board side fixation screw 24 is insulated from the metal casing 22 by the insulation plate 23 and the printed-circuit-board side fixation screw 24 and the metal casing 22 have different electric potentials.

In the above situation, there is a possibility that a floating metal having an unfixed electric potential will cause an insulation breakdown through unintended charging, and thus it is desirable that the electric potential of the printed-circuit-board side fixation screw 24 be fixed by connecting the printed-circuit-board side fixation screw 24 to a certain electric potential (e.g., a positive or negative electric potential in the direct current part etc.) via a wiring pattern on the printed circuit board 21.

Further, the electric potential of the printed-circuit-board side fixation screw 24 is made to match the electric potential of the wiring pattern around the screw 24, and is fixed to an electric potential that minimizes the insulation distance between the screw 24 and the metal casing 22, and thereby the wiring pattern area and the component mounting space increase in the printed circuit board 21, making it possible to reduce the size of the electronic device.

Note that in the explanations above, an example is given of embedding "helical inserts" in the insulation plate as members for fixing screws; however it is also possible to embed "irisert" (registered trademark) in the insulation plate.

INDUSTRIAL APPLICABILITY

The present invention has been explained using an example in which a printed circuit board and a metal casing having an insulation plate between them are fixed by metal screws from their surfaces, while the present invention can also be applied to a case where a metal plate mounting a component etc. and a metal casing having an insulation plate between them are fixed by metal screws from their surfaces.

What is claimed is:

1. A printed circuit board insulation structure for an electronic device and for fixing a printed circuit board in the electronic device to a metal casing, the printed circuit board insulation structure comprising:
   a resin insulation plate having first and second helical inserts embedded in the insulation plate;
   a metal screw including a first screw and a second screw, the first and second screws are respectively fastened to the first and second helical inserts embedded in the insulation plate, and fastening positions of the first and second screws to the insulation plate are arranged with a lateral shift on the insulation plate, and wherein
   a lateral distance between the first and second helical inserts is equal to or greater than at least one of
      a distance between a bottom surface of the first helical insert and the metal casing, and
      a distance between a bottom surface of the second helical insert and the printed circuit board,
   the metal screw and the resin insulation plate fix the printed circuit board in the electronic device to the metal casing.

2. The printed circuit board insulation structure for an electronic device according to claim 1, wherein
   the first screw is a fixation screw provided on a printed circuit board side and the second screw is a fixation screw provided on a metal casing side.

3. The printed circuit board insulation structure for an electronic device according to claim 1, wherein
   the first helical insert is a helical insert provided on a printed circuit board side and the second helical insert is a helical insert provided on a metal casing side.

4. The printed circuit board insulation structure for an electronic device according to claim 1, wherein
   the first screw is insulated from the metal casing by the insulation plate, an electric potential of the first screw is connected and fixed to an electric potential in a circuit on the printed circuit board in order to make the electric potential of the first screw different from an electric potential of the metal casing, and the electric potential of the first screw is made to match an electric potential of a wiring pattern of the printed circuit board around the first screw and is fixed to a value that minimizes an insulation distance between the first screw and the metal casing.

5. The printed circuit board insulation structure for an electronic device according to claim 4, wherein
   the insulation plate is configured to be a cuboid, and the insulation plate is arranged so as to match shapes of longer sides of the printed circuit board and the metal casing which are longer than other sides of the printed circuit board and the metal casing.

* * * * *